(12) United States Patent
Gillingham

(10) Patent No.: US 8,880,970 B2
(45) Date of Patent: Nov. 4, 2014

(54) ERROR DETECTION METHOD AND A SYSTEM INCLUDING ONE OR MORE MEMORY DEVICES

(75) Inventor: Peter B. Gillingham, Kanata (CA)

(73) Assignee: Conversant Intellectual Property Management Inc., Plano, TX (US)

( * ) Notice: Subject to any disclaimer, the term of this patent is extended or adjusted under 35 U.S.C. 154(b) by 916 days.

(21) Appl. No.: 12/418,892

(22) Filed: Apr. 6, 2009

(65) Prior Publication Data
US 2010/0162053 A1   Jun. 24, 2010

Related U.S. Application Data

(60) Provisional application No. 61/140,147, filed on Dec. 23, 2008.

(51) Int. Cl.
  *G06F 11/00* (2006.01)
  *G06F 11/10* (2006.01)
  *H04L 1/18* (2006.01)

(52) U.S. Cl.
  CPC ............. *G06F 11/10* (2013.01); *H04L 1/1887* (2013.01); *H04L 1/1819* (2013.01)
  USPC .......................................... 714/748; 714/749

(58) Field of Classification Search
  CPC ........................... H04L 1/1887; H04L 1/1819
  USPC .................... 714/42, 763, 758, 765
  See application file for complete search history.

(56) References Cited

U.S. PATENT DOCUMENTS

| | | | |
|---|---|---|---|
| 4,425,616 A * | 1/1984 | Woodell | 718/107 |
| 4,899,316 A | 2/1990 | Nagami | |
| 5,938,742 A | 8/1999 | Faddell et al. | |
| 5,956,349 A * | 9/1999 | Watanabe et al. | 714/718 |
| 6,003,151 A * | 12/1999 | Chuang | 714/752 |
| 6,102,963 A | 8/2000 | Agrawal | |
| 6,381,688 B1 | 4/2002 | Gates et al. | |
| 6,480,982 B1 * | 11/2002 | Chan et al. | 714/764 |
| 6,691,257 B1 | 2/2004 | Suffin | |
| 7,130,958 B2 | 10/2006 | Chou et al. | |

(Continued)

FOREIGN PATENT DOCUMENTS

| | | |
|---|---|---|
| JP | 2008-509499 | 3/2008 |
| WO | WO 01/69411 | 9/2001 |

OTHER PUBLICATIONS

Oshima, et al., "High-Speed Memory Architectures for Multimedia Applications", Circuits & Devices, IEEE 8755-3996/97, pp. 8-13, Jan. 1997.

(Continued)

*Primary Examiner* — Sarai Butler (74) *Attorney, Agent, or Firm* — Conley Rose, P.C.; J. Robert Brown, Jr.

(57) ABSTRACT

A system including one or more memory devices, and an error detection and correction method are disclosed. A memory device of the system includes an input for receiving a packet. A first portion of the packet may include at least one command byte, and a second portion of the packet may include parity bits to facilitate command error detection. The memory device may include an error manager configured to detect, based on the parity bits, whether an error exists in the at least one command byte, and circuitry configured to provide the packet to the error manager.

28 Claims, 8 Drawing Sheets

(56) References Cited

U.S. PATENT DOCUMENTS

| | | | |
|---|---|---|---|
| 7,296,213 B2 | 11/2007 | Vainsencher et al. | |
| 7,836,340 B2 | 11/2010 | Schuetz | |
| 7,957,173 B2 | 6/2011 | Kim | |
| 8,375,146 B2 | 2/2013 | Sinclair | |
| 2001/0013104 A1* | 8/2001 | Mann et al. | 714/6 |
| 2004/0148482 A1 | 7/2004 | Grundy et al. | |
| 2004/0230879 A1 | 11/2004 | Crosby | |
| 2005/0034033 A1* | 2/2005 | Nemawarkar et al. | 714/52 |
| 2006/0277434 A1* | 12/2006 | Tsern et al. | 714/17 |
| 2006/0282757 A1 | 12/2006 | Kim et al. | |
| 2007/0028030 A1 | 2/2007 | Mahrla et al. | |
| 2007/0067705 A1* | 3/2007 | Kim | 714/801 |
| 2007/0076502 A1 | 4/2007 | Pyeon et al. | |
| 2007/0109833 A1 | 5/2007 | Pyeon et al. | |
| 2007/0153576 A1 | 7/2007 | Oh et al. | |
| 2007/0165457 A1 | 7/2007 | Kim | |
| 2007/0233903 A1 | 10/2007 | Pyeon | |
| 2007/0233917 A1 | 10/2007 | Pyeon et al. | |
| 2007/0233939 A1 | 10/2007 | Kim | |
| 2008/0049505 A1 | 2/2008 | Kim et al. | |
| 2008/0052449 A1 | 2/2008 | Kim et al. | |
| 2008/0080492 A1 | 4/2008 | Pyeon et al. | |
| 2008/0130386 A1 | 6/2008 | Pyeon | |
| 2008/0133986 A1 | 6/2008 | Vainsencher et al. | |
| 2008/0155179 A1 | 6/2008 | Pyeon et al. | |
| 2008/0168319 A1 | 7/2008 | Lee et al. | |
| 2008/0201548 A1 | 8/2008 | Przybylski et al. | |
| 2008/0215954 A1 | 9/2008 | Oshikiri | |
| 2008/0294959 A1* | 11/2008 | Chindapol et al. | 714/752 |
| 2009/0210774 A1* | 8/2009 | Godard et al. | 714/801 |
| 2009/0282300 A1* | 11/2009 | Heyrman et al. | 714/708 |
| 2009/0327532 A1* | 12/2009 | Jeddeloh | 710/22 |

OTHER PUBLICATIONS

Diamond, S.L., "SyncLink: High: High-speed DRAM for the Future", Micro Standards, IEEE Micro, pp. 74-75, Dec. 1996.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, Mar. 1996.

Gjessing, Stein, et al., "RamLink: A High-Bandwidth Point-to-Point Memory Architecture", IEEE 0-8186-2655-0/92, pp. 328-331, 1992.

Gjessing, Stein, et al., "Performance of the RamLink Memory Architecture", Proceedings of the Twenty-Seventh Annual Hawaii International Conference on System Sciences, IEEE 1060-3425/94, pp. 154-162, 1994.

Gjessing, Stein, et al., "A RAM link for high speed", Special Report/Memory, IEEE Spectrum, pp. 52-53, Oct. 1992.

"HyperTransportTM IO Link Specification", Revision 3.00, Document No. HTC20051222-0046-0008, HyperTransport Technology Consortium, pp. 1-428, (Apr. 2006).

PCT/CA2009/001777, MOSAID Technologies Incorporated, International Search Reoprt.

* cited by examiner

$P1 = D3 \oplus D5 \oplus D7 \oplus D9 \oplus D11 \oplus D13 \oplus D15 \oplus D17 \oplus D19 \oplus D21 \oplus D23 \oplus D25 \oplus D27 \oplus D29 \oplus D31 \oplus D33 \oplus D35 \oplus D37 \oplus D39 \oplus D41 \oplus D43 \oplus D45 \oplus D47 \oplus D49 \oplus D51 \oplus D53 \oplus D55 \oplus D57 \oplus D59 \oplus D61$ $P2 = D3 \oplus D6 \oplus D7 \oplus D10 \oplus D11 \oplus D14 \oplus D15 \oplus D18 \oplus D19 \oplus D22 \oplus D23 \oplus D26 \oplus D27 \oplus D30 \oplus D31 \oplus D34 \oplus D35 \oplus D38 \oplus D39 \oplus D42 \oplus D43 \oplus D46 \oplus D47 \oplus D50 \oplus D51 \oplus D54 \oplus D55 \oplus D58 \oplus D59 \oplus D62$ $P4 = D5 \oplus D6 \oplus D7 \oplus D12 \oplus D13 \oplus D14 \oplus D15 \oplus D20 \oplus D21 \oplus D22 \oplus D23 \oplus D28 \oplus D29 \oplus D30 \oplus D31 \oplus D36 \oplus D37 \oplus D38 \oplus D39 \oplus D44 \oplus D45 \oplus D46 \oplus D47 \oplus D52 \oplus D53 \oplus D54 \oplus D55 \oplus D60 \oplus D61 \oplus D62$ $P8 = D9 \oplus D10 \oplus D11 \oplus D12 \oplus D13 \oplus D14 \oplus D15 \oplus D24 \oplus D25 \oplus D26 \oplus D27 \oplus D28 \oplus D29 \oplus D30 \oplus D31 \oplus D40 \oplus D41 \oplus D42 \oplus D43 \oplus D44 \oplus D45 \oplus D46 \oplus D47 \oplus D56 \oplus D57 \oplus D58 \oplus D59 \oplus D60 \oplus D61 \oplus D62$ $P16 = D17 \oplus D18 \oplus D19 \oplus D20 \oplus D21 \oplus D22 \oplus D23 \oplus D24 \oplus D25 \oplus D26 \oplus D27 \oplus D28 \oplus D29 \oplus D30 \oplus D31 \oplus D48 \oplus D49 \oplus D50 \oplus D51 \oplus D52 \oplus D53 \oplus D54 \oplus D55 \oplus D56 \oplus D57 \oplus D58 \oplus D59 \oplus D60 \oplus D61 \oplus D62$ $P32 = D33 \oplus D34 \oplus D35 \oplus D36 \oplus D37 \oplus D38 \oplus D39 \oplus D40 \oplus D41 \oplus D42 \oplus D43 \oplus D44 \oplus D45 \oplus D46 \oplus D47 \oplus D48 \oplus D49 \oplus D50 \oplus D51 \oplus D52 \oplus D53 \oplus D54 \oplus D55 \oplus D56 \oplus D57 \oplus D58 \oplus D59 \oplus D60 \oplus D61 \oplus D62$ $P64 = 0$ $P0$ = exclusive OR of all data payload bits

ERROR DETECTION METHOD AND A SYSTEM INCLUDING ONE OR MORE MEMORY DEVICES

CROSS REFERENCE TO RELATED APPLICATIONS

This application claims the benefit of priority of U.S. Provisional Patent Application Ser. No. 61/140,147 filed Dec. 23, 2008, which is incorporated herein by reference in its entirety.

BACKGROUND OF THE DISCLOSURE

Computers and other information technology systems typically contain semiconductor devices such as memory. The semiconductor devices are controlled by a controller, which may form part of the central processing unit (CPU) of a computer or may be separate therefrom. The controller has an interface for communicating information to and from the semiconductor devices. It is known that errors can sometimes occur in the communicated information for various reasons, and many known systems lack a capability of correcting errors, or at least lack a satisfactory capability of correcting many of the errors.

SUMMARY

It is an object of the invention to provide an improved system that includes one or more memory devices.

According to one aspect of the invention, there is provided a memory device that includes an input for receiving a packet, a first portion of the packet including at least one command byte, and a second portion of the packet including parity bits to facilitate command error detection. An error manager is configured to detect, based on the parity bits, whether an error exists in the at least one command byte. The memory device also includes circuitry configured to provide the packet to the error manager.

According to another aspect of the invention, there is provided a system that includes a plurality of semiconductor memory devices and a controller device for communicating with the devices. The controller includes a command engine for generating a memory device-destined packet. A first portion of the packet includes at least one command byte, and a second portion of the packet includes parity bits to facilitate command error detection. An output of the controller device is capable of outputting the packet to a first device of the plurality of semiconductor memory devices. A series-interconnection configuration existing between the controller device and the semiconductor memory devices of the system, such that the system has a point-to-point ring topology.

According to yet another aspect of the invention, there is provided a method carried out within a memory device having an input for receiving a packet. The method includes receiving the packet, a first portion of the packet including at least one command byte, and a second portion of the packet including parity bits to facilitate command error detection. The method also includes detecting, based on the parity bits, whether an error exists in the at least one command byte.

Thus, an improved system that includes one or more memory devices has been provided.

BRIEF DESCRIPTION OF THE DRAWINGS

Reference will now be made, by way of example, to the accompanying drawings.

Similar or the same reference numerals may have been used in different figures to denote similar example features illustrated in the drawings.

DETAILED DESCRIPTION OF EXAMPLE EMBODIMENTS

Examples of systems having ring-type topologies are described in US patent application publication No. 2008/0201548 A1 entitled "SYSTEM HAVING ONE OR MORE MEMORY DEVICES" which was published on Aug. 21, 2008, U.S. Patent Application Publication No. 2008/0049505 A1 entitled "SCALABLE MEMORY SYSTEM" which was published on Feb. 28, 2008, and US patent application publication No. 2008/0052449 A1 entitled "MODULAR COMMAND STRUCTURE FOR MEMORY AND MEMORY SYSTEM" which was published on Feb. 28, 2008. At various points in the description that follows, references will be made to certain example command, address and data formats, protocols, internal device structures, bus transactions, etc., and those skilled in the art will appreciate that further example details can be quickly obtained with reference to the above-mentioned patent references.

Figure 1A:
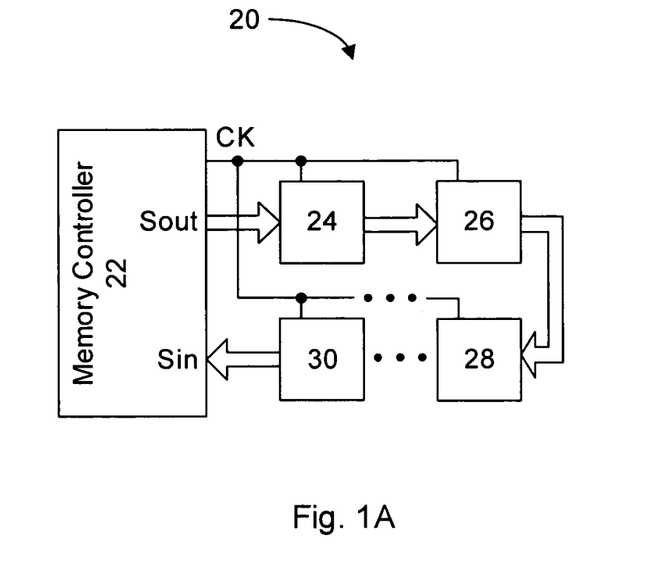
FIG. 1A is a block diagram of an example system that receives a parallel clock signal.
Figure 1B:
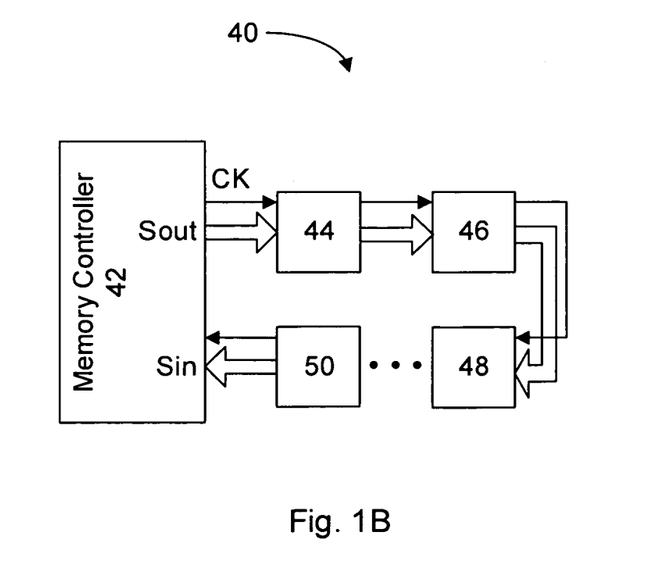
FIG. 1B is a block diagram of an example system that receives a source synchronous clock signal.

Reference will now be made to FIGS. 1A and 1B. In accordance with some example embodiments, command packets originate from the controller and are passed around the ring through each memory device in a point-to-point fashion until they end up back at the controller. Referring to FIG. 1A, there is a block diagram of an example system that receives a parallel clock signal, while FIG. 1B is a block diagram of the same system of FIG. 1A receiving a source synchronous clock signal. The clock signal can be either a single ended clock signal or a differential clock pair.

In FIG. 1A, the system 20 includes a memory controller 22 having at least one output port Sout and an input port Sin, and memory devices 24, 26, 28 and 30 that are connected in series, such that a series-interconnection configuration exists between the controller device and the memory devices of the system. While not explicitly labeled in FIG. 1A, each memory device has an Sin input port and an Sout output port. Input and output ports consist of one or more physical pins or connections interfacing the memory device to the system it is a part of. In some instances, the memory devices are flash memory devices. The current example of FIG. 1A includes four memory devices, but alternate examples can include a single memory device, or any suitable number of memory devices. Accordingly, if memory device 24 is the first device of the system 20 as it is connected to Sout of memory controller 22, then memory device 30 is the Nth or last device as it is connected to Sin of memory controller 22, where N is an integer number greater than zero. Memory devices 26 to 28 are then intervening serially connected memory devices between the first and last memory devices. Each memory device can assume a distinct identification (ID) number, or device address (DA) upon power up initialization of the system, so that they are individually addressable. Several commonly owned U.S. patent applications describe methods for generating and assigning device addresses for serially connected memory devices of a system. See for example U.S. Patent Application Publication No. 2007/0233917 A1 titled "APPARATUS AND METHOD FOR ESTABLISHING DEVICE IDENTIFIERS FOR SERIALLY INTERCONNECTED DEVICES" and U.S. Patent Application Publication No. 2008/0080492 A1 titled "PACKET BASED ID GENERATION FOR SERIALLY INTERCONNECTED DEVICES".

Memory devices 24 to 30 (FIG. 1A) are considered serially connected because the data input of one memory device is connected to the data output of a previous memory device, thereby forming a series-connection system organization, with the exception of the first and last memory devices in the chain. The channel of memory controller 22 includes data, address, and control information provided by separate pins, or the same pins, connected to conductive lines. The example of FIG. 1A includes one channel, where the one channel includes Sout and corresponding Sin ports. However, memory controller 22 can include any suitable number of channels for accommodating separate memory device chains. In the example of FIG. 1A, the memory controller 22 provides a clock signal CK, which is connected in parallel to all the memory devices.

In general operation, the memory controller 22 issues a command through its Sout port, which includes an operation code (op code), a device address, optional address information for reading or programming, and optional data for register programming. The command may be issued as a serial bitstream command packet, where the packet can be logically subdivided into segments of a predetermined size. Each segment can be one byte in size for example. A bitstream is a sequence or series of bits provided over time. The command is received by the first memory device 24 through its input port Sin, which compares the device address to its assigned address. If the addresses match, then memory device 24 executes the command. The command is passed through its own output port Sout to the next memory device 26, where the same procedure is repeated. Eventually, the memory device having the matching device address, referred to as a selected memory device, will perform the operation specified by the command. If the command is a read data command, the selected memory device will output the read data through its output port Sout (not labeled), which is serially passed through intervening memory devices until it reaches the Sin port of the memory controller 22. Since the commands and data are provided in a serial bitstream, the clock is used by each memory device for clocking in and clocking out the serial bits and for synchronizing internal memory device operations. This clock is used by all the memory devices in the system 20.

Because the clock frequency used in the system according to FIG. 1A is relatively low, unterminated full swing CMOS signaling levels can be used to provide robust data communication. This is also referred to as Low Voltage Transistor Transistor Logic (LVTTL) signaling, as would be well known to those skilled in the art.

A further performance improvement over the system 20 of FIG. 1A can be obtained by the system of FIG. 1B. System 40 of FIG. 1B is similar to the system 20 of FIG. 1A (for example, as in FIG. 1A a series-interconnection configuration exists between the controller device and the semiconductor memory devices of the system) except that the clock signal CK is provided serially to each memory device from a previous device not necessarily memory controller 42. Each memory device 44, 46, 48 and 50 may receive the source synchronous clock on its clock input port and forward it via its clock output port to the next device in the system. In some examples of the system 40, the clock signal CK is passed from one memory device to another via short signal lines. In such circumstances none of the clock performance issues related to the parallel clock distribution scheme (such as loading by multiple devices) are present, and CK can operate at high frequencies. Accordingly, the system 40 can operate with greater speed than the system 20 of FIG. 1A. For example, High Speed Transceiver Logic (HSTL) signaling can be used to provide high performance data communication. In the HSTL signaling format, each memory device may receive a reference voltage that is used for determining a logic state of the incoming data signals. Another similar signaling format is the Stub Series Terminated Logic (SSTL) signaling format. Accordingly, the data and clock input circuits in the memory devices of the systems 20 and 40 are structured differently from each other. Both the HSTL and SSTL signaling formats should be well known to those skilled in the art.

Figure 2A:
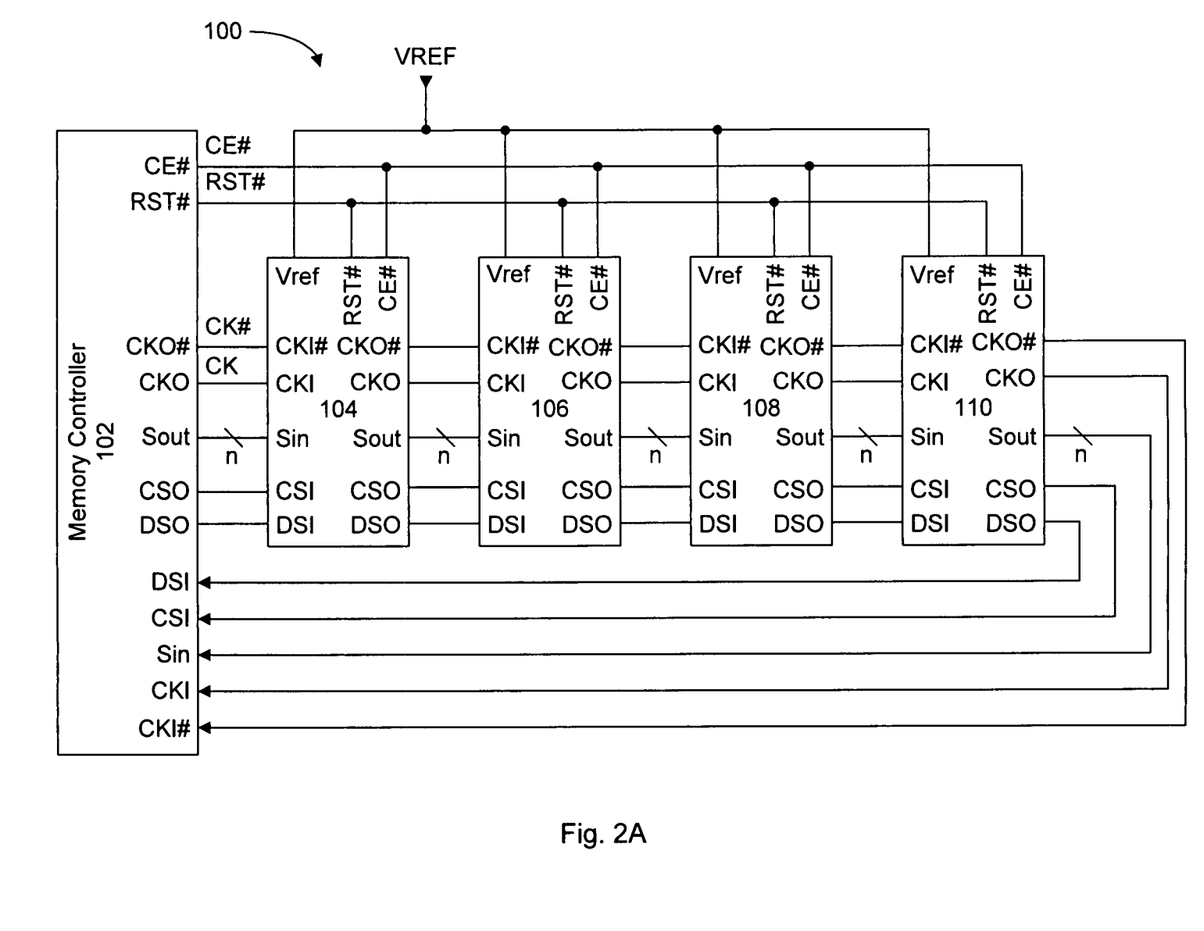
FIG. 2A is a block diagram of an example system similar to the system of FIG. 1B, but it being a more specific example system.

Now in order to provide a more specific example of a system of the type shown in FIG. 1B, reference will now be made to FIG. 2A. In FIG. 2A, a system 100 includes a memory controller 102 and four memory devices 104, 106, 108 and 110. The memory controller 102 provides control signals in parallel to the memory devices. These include the chip enable signal CE# and the reset signal RST#. In one example use of CE#, the devices are enabled when CE# is at the low logic level. In a number of previously considered devices, once a Flash memory device started a program or erase operation, CE# could be de-asserted, or driven to a high logic level. However in one example embodiment, de-asserting CE# has the effect of disabling communication from Sin to Sout of the disabled serial memory device. Since the serial memory devices are connected in a ring, disabling any of the devices breaks communication around the ring and the memory controller becomes unable to communicate with all of the memory devices in the memory system. As a result, CE# is a common signal to all serial memory devices, and is used to put the entire memory into a low power state. In one example use of RST#, the memory device is set to a reset mode when RST# is at the low logic level. In the reset mode, the power is allowed to stabilize and the device prepares itself for operation by initializing all finite state machines and resetting any configuration and status registers to their default states. The memory controller 102 includes clock output ports CKO# and CKO for providing complementary clock signals CK and CK#, and clock input ports CKI# and CKI for receiving the complementary clock signals from the last memory device of the system. Each memory device may include a clock synthesizer, such as a DLL or a PLL for generating phases of the received clocks. Certain phases may be used to center the clock edges within the input data valid window internally to ensure reliable operation. Each memory device in FIG. 2A has clock output ports CKO# and CKO for passing the complementary clock signals to the clock input ports of the next memory device, and clock input ports CKI and CKI# for receiving the complementary clock signals from either the memory controller 102 or a previous memory device. The last memory device 110 provides the clock signals back to the memory controller 102.

The channel of memory controller 102 includes data output port Sout, data input port Sin, a command strobe input CSI, a command strobe output CSO, data strobe input DSI, and a data strobe output DSO. Output port Sout and input port Sin can be one bit in width, or n bits in width where n is a positive integer, depending on the characteristics of the memory controller. For example, if n is 1 then one byte of data is received after eight data latching edges of the clock. A data latching clock edge can be a rising clock edge for example in single data rate (SDR) operation, or both rising and falling edges of the clock for example in double data rate (DDR) operation. If n is 2 then one byte of data is received after four latching edges of the clock. If n is 4 then one byte of data is received after two latching edges of the clock. The memory device can be statically configured or dynamically configured for any width of Sout and Sin. Hence, in a configuration where n is greater than 1, the memory controller provides data in parallel bitstreams. CSI is used for controlling or enabling the latching command data appearing on the input port Sin, and has a pulse duration for delimiting the time when a command is present on the data input port Sin. More specifically, the command data will have a duration measured by a number of clock cycles, and the pulse duration of the CSI signal will have a corresponding duration. DSI is used for enabling the output port Sout buffer of a selected memory device to output read data, and has a pulse duration for delimiting read data provided from the memory device data output port Sout so that the memory controller can control the amount of data in a read transaction.

Since the presently described embodiment of FIG. 2A is intended for high speed operation, a high speed signaling format, such as the HSTL signaling format for example, is used. Accordingly, a reference voltage VREF is provided to each memory device which is used by each memory device to determine the logic level of the signals received at the Sin, CSI and DSI input ports. The reference voltage VREF may be generated by another circuit on the printed circuit board, for example, and is set to a predetermined voltage level based on the voltage swing mid-point of the HSTL signal.

In use of the embodiment of FIG. 2A, each memory device is positioned on a printed circuit board such that the distance and signal track length between the Sout output port pins on one device and the Sin input port pins of the next device in the ring is minimized. Alternately, the four memory devices can be collected in a system in package module (SIP) which further minimizes signal track lengths. Memory controller 102 and memory devices 104 to 110 are serially connected to form a ring topology, meaning that the last memory device 110 provides its outputs back to the memory controller 102. As such, those skilled in the art will understand that the distance between memory device 110 and memory controller 102 is easily minimized.

Figure 2B:
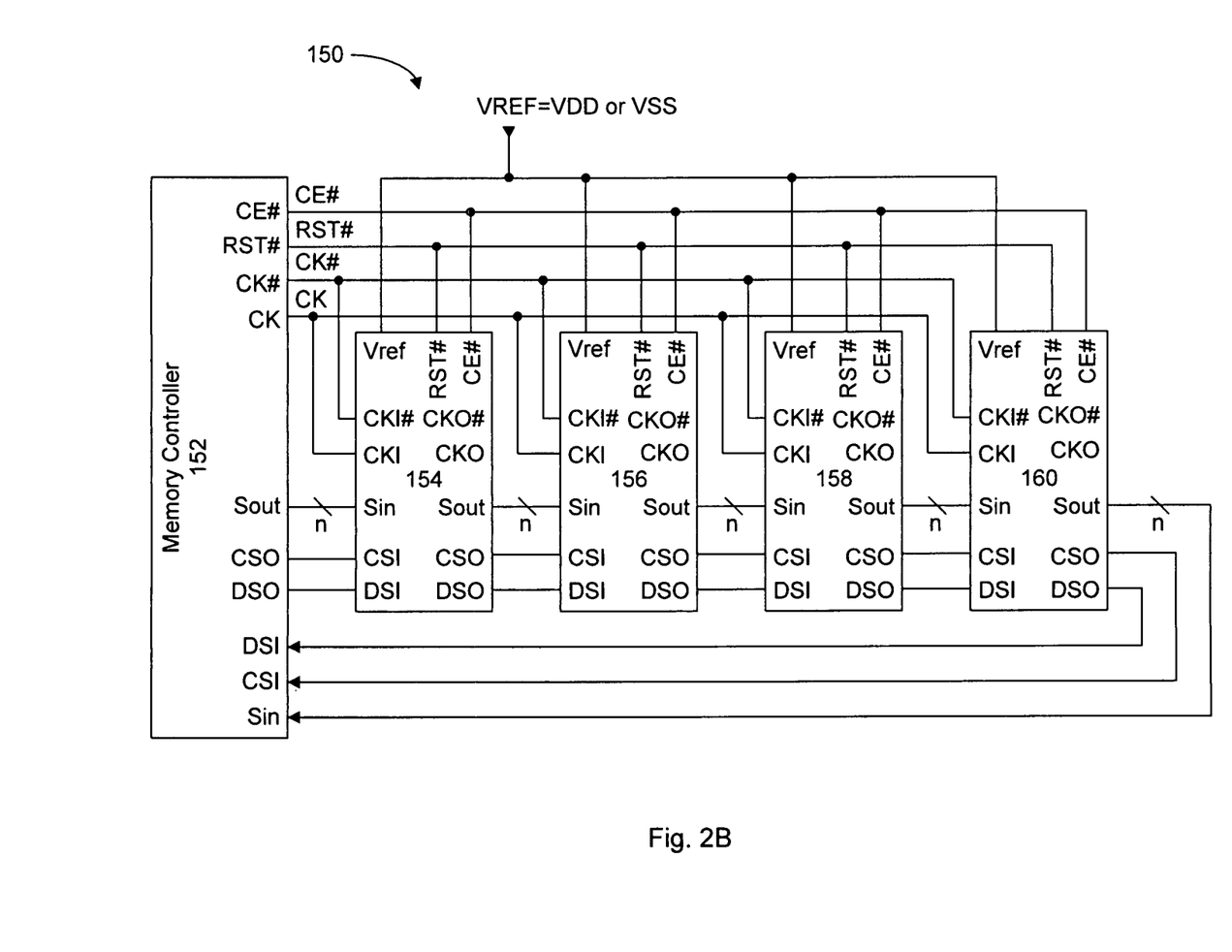
FIG. 2B is a block diagram of an example system similar to the system of FIG. 1A, but it being a more specific example system.

In FIG. 2B, a system 150 includes a memory controller 152 and memory devices 154, 156, 158 and 160. The memory controller 152 may be designed to provide similar functionality to that of the memory controller 102 illustrated in FIG. 2A, except that the clock signals are provided in parallel, therefore the clock output ports CKO# and CKO of each memory device are not present or unconnected. Furthermore, the signaling format for the data and the strobe signals is different for the system of FIG. 2B as compared with the system of FIG. 2A. For example, the signaling format for the system of FIG. 2B can be the full swing un-terminated LVTTL signaling format. The LVTTL signaling used in conjunction with lower clock frequencies does not use a reference voltage VREF. Memory devices for use only in systems of FIG. 2B do not need a VREF input. If a VREF input is present, it is because they are also capable of communicating according to a high-speed signaling convention that does require VREF. In such a case VREF is set to a voltage level other than the signaling midpoint out of convenience or to indicate that LVTTL signaling is being used. For example, for such a device, VREF might be set to either VDD or VSS to indicate LVTTL signaling and a network organization according the FIG. 2B, as opposed to HSTL signaling and a network configuration according to FIG. 2A.

According to an example embodiment, memory devices 104, 106, 108 and 110 of FIG. 2A and memory devices 154, 156, 158 and 160 of FIG. 2B can be any type of memory device having an input/output interface designed for serial interconnection with other memory devices. According to the presently described embodiments, the memory devices of FIGS. 2A and 2B may be the same, and are thus operable in both systems as they will have input and output buffer circuits which can operate with LVTTL input signals or HSTL input signals. Those skilled in the art will understand that the memory devices can include input and output buffer circuits for operating with other types of signal formats than those of LVTTL or HSTL signals.

Figure 3:
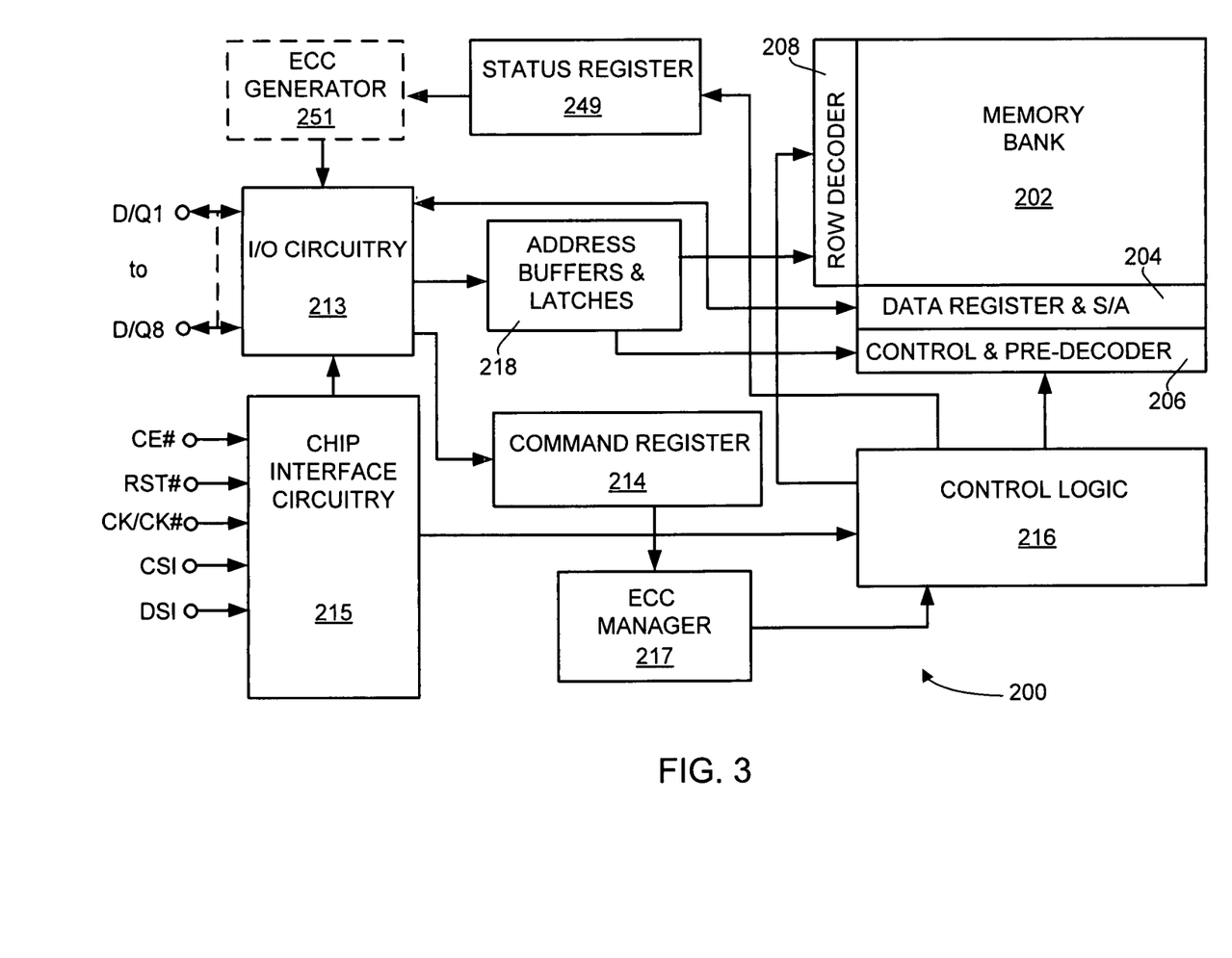
FIG. 3 is a diagram of an example memory device.

As mentioned, each of the systems shown in the previous figures include one or more memory devices and, in accordance with an example embodiment, FIG. 3 is a diagram of an example memory device 200 that may be provided within any one of the previously described systems. The novel memory device 200 has a memory bank 202 which in at least some examples is a NAND flash cell array structure having a plurality (n) of erasable blocks. Each of the erasable blocks is subdivided into a plurality (m) of programmable pages. Each of the pages consists of O+k) bytes. The pages are further divided into a j-byte data storage region in which data is stored and a separate k-byte region typically used for error management functions. Each page comprises, for example, 2,112 bytes of which 2,048 bytes would be used for data storage and 64 bytes would be used for error management functions. The memory bank 202 as described above is accessed by the pages. Although FIG. 3 shows a single memory bank 202, the memory device 200 may have more than one memory bank 202.

Commands for accessing the memory bank 202 are received by a command register 214 via I/O (Input/Output) circuitry 213 from the controller. The received commands enter the command register 214 and remain there until execution. The control logic 216 converts the commands into a form that can be executed against the memory bank 202. The commands generally enter the memory device 200 via the assertion of different pins on the external packaging of the chip, where different pins may be used to represent different commands. For example, the commands may include read, program, erase, register read, and register write. With respect to register write, in one example the memory device 200 may be capable of processing a 5-byte register write command packet comprising one byte for the ID, one byte for the command, and the remaining bytes as payload.

The read and program commands are executed on a page basis while the erase commands are executed on a block basis. Also, in a number of examples of the memory device 200, various pins of the device are each associated with one of the strobe port(s), one of the data port(s) or other port as previously described in connection with FIGS. 2A and 2B. Whereas the I/O circuitry 213 is shown between the data pins and internal components of the memory device 200, chip interface circuitry 215 is shown between other pins and internal components of the memory device 200.

When a read or program command is received by the command register 214 via the I/O circuitry 213, an address for the page in the memory bank 202 to which the command pertains is provided by the I/O circuitry 213 to address buffers and latches 218. From the address buffers and latches 218, address information is then provided to control and predecoder 206, sense amplifier (S/A) and data register 204 and row decoder 208 for accessing the page indicated by the address. With respect to a read operation, the data register 204 receives the complete page which is then provided to the I/O circuitry 213 (more specifically it is provided to the following sub-components of the I/O circuitry 213 which are not explicitly shown: I/O buffers and latches, and then output drivers) for output from the memory device 200.

The address buffers and latches 218 determine the page in which the address is located and provide a row address(es) corresponding to the page to the row decoder 208. The corresponding row is activated. The data register and S/A 204 sense the page and transfer the data from the page into the data register 204. Once the data from the entire page has been transferred to the data register, the data is sequentially read from the device via the I/O circuitry 213.

A program command is also processed on a page basis. The program command is received by the command register 214 via the I/O circuitry 213, an accompanying address is received by the address buffers 218 via the I/O circuitry 213. Input data is received by the I/O circuitry 213 for transfer to the data register 204. Once all of the input data is in the data register 204, the page on which the input data is to be stored is programmed with the input data.

An erase command is processed on a block basis. The erase command is received by the command register 214 via the I/O circuitry 213, and a block address is received by the address buffers 218 via the I/O circuitry 213.

The illustrated memory device 200 optionally also includes an ECC manager 217. The ECC manager 217 enables error detection and correction in accordance with example embodiments that are described subsequently in more detail. The illustrated ECC manager is shown in communication with the control logic 216; however in an alternative example the ECC manager might include circuitry and logic permitting it to act directly upon other illustrated components such as, for example, one or more of the address buffers and latches 218, and the command register 214. Those skilled in the art will appreciate the existence of various known circuitries through which packets could be provided to the ECC manager 217 from an input of the memory device 200.

The illustrated memory device 200 also includes one or more status registers 249 (many types of conventional status registers are well known to those skilled in the art). Under control from the control logic 216, a status register may provide status-type information intended for the controller of the system, and typically providing this information in a manner that does not interfere with other information and data being communicated through the I/O circuitry 213. In one example, information stored in the status register 249 may be specifically be transmitted out via one or more dedicated pins on the memory device. In this regard, an optional ECC generator 251 may be provided between the status register 249 and the I/O circuitry 213 to facilitate this process.

Figure 4:
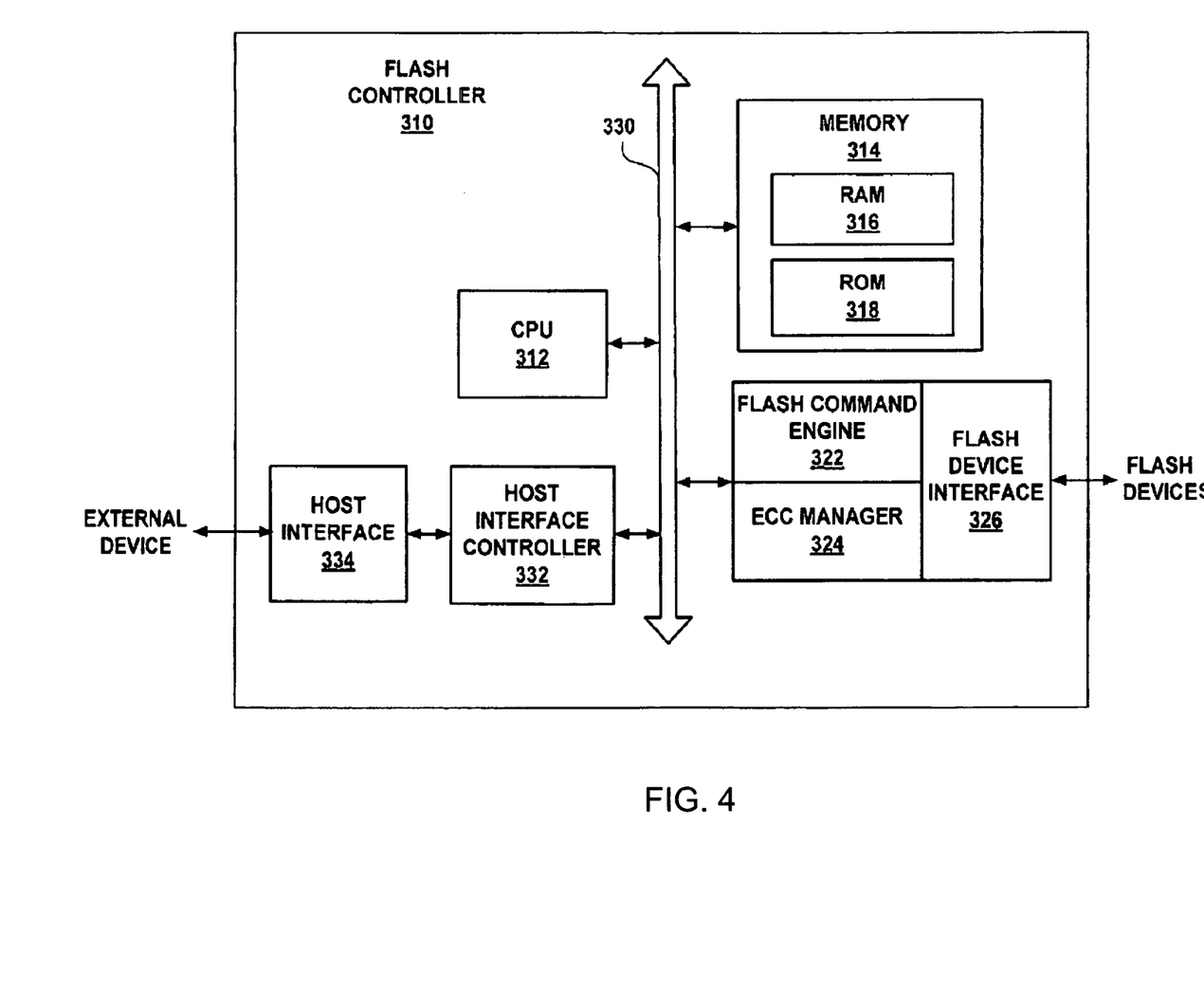
FIG. 4 is a diagram of an example memory controller.

As mentioned, each of the systems shown in FIGS. 1A, 1B, 2A and 2B include a memory controller, and a block diagram of an example suitable memory controller 310 is shown in FIG. 4.

Referring to FIG. 4, the illustrated novel flash controller 310 includes a central processing unit (CPU) 312; and a memory 314 having, for instance, a random access memory (RAM) 316 and a read only memory (ROM) 318. As will be appreciated by those skilled in the art, the flash controller 310 can be configured as a system on chip, system in package or multiple chips. Also, the illustrated flash controller 310 includes a flash command engine 322, an error correcting code (ECC) manager 324 and a flash device interface 326. In a number of examples, the flash device interface may include either the memory controller ports shown in FIG. 2A or the memory controller ports shown in FIG. 2B, and (as was similarly described in relation to the memory device) each of these may be associated with a respective pin of the memory controller 310. For convenience of illustration, rather than explicitly showing in FIG. 4 all of the pins of the flash controller 310, the pins are represented by labeled flash device interface 326.

Still with reference to FIG. 4, the illustrated flash controller 310 includes a host interface controller 332 and a host interface 334. The CPU 312, the memory 314, the flash command engine 322 and the host interface controller 332 are connected through a common bus 330. The host interface 334 is for connection to an external device through a bus, connection links, interface or like (for example, ATA (Advanced Technology Attachment), PATA (Parallel ATA), SATA (Serial ATA), USB (universal serial bus), or PCIe (PCI Express)). The host interface 334 is controlled by the host interface controller 332. The CPU 312 of the illustrated example operates with instructions stored in the ROM 318 and processed data is stored in the RAM 316. The flash command engine 322 interprets the commands and the flash controller 310 controls the operations of the flash devices through the flash device interface 326. Also, in some example the flash command engine 322 generates a memory device-destined packet. The ECC manager 324, amongst other possible functions such as program data error code generation and read data error code checking and read data correction, generates an error correcting code (ECC) to ensure that certain commands are performed successfully and completely. The ECC manager enables error detection and correction in accordance with example embodiments that are described subsequently in more detail.

Now if a transmission error occurs in a command packet, one approach for dealing with the error would be for the controller 310 to detect the error by comparing the received packet to the packet originally transmitted. This is a useful feature of the ring topology as compared to a bus topology, in which there is no inherent mechanism for a controller to detect whether memory devices properly received a command. However, even with this error detection method in a ring topology, it may be too late to correct the error by the time it has been detected. For example, if the command packet was a program or an erase command and an error occurred in one of the address bits (any one of device address, block address, or page address), the program or erase operation may have already started by the time the controller detects the error, and data may be irretrievably lost when the wrong address is overwritten or erased. Another potentially unrecoverable error occurs when a non-program or a non-erase command is erroneously received as a program or erase command. Generally an erroneous read command is not a problem since the controller can simply request another read operation and discard the unwanted data.

Generally there is more concern about errors in the command than in data written to or read from the memory array. There are many schemes for embedding error detection and correction codes within the data. Some data is more critical and can have more robust error schemes which generally have higher overhead and greater performance impact. The system designer can determine the level of robustness required. The problem being addressed by at least some example embodiments relates to errors in the command, address and register write fields. These errors cannot be resolved with error detection and correction codes within read and write data. There are many forms of command, address, and register write errors that may occur. Generally an unintentional read is not a problem because the data can be ignored and the controller 310 can re-issue the command. A page read to a busy memory bank will simply be ignored. Errors may occur somewhere in the ring either before the target device or after the device. Table 1 below details the impact of an error dependent upon the location.

TABLE 1

Possible Fatal Single Bit Error Scenarios

| Single bit error location | Error occurs before target device | Error occurs after target device |
|---|---|---|
| Device Address | Command may execute in the wrong device or no device at all | Command will execute in the target device and may execute in another device |
| Command | Command may be misinterpreted as a program or erase command thereby destroying data, or as a register write command reconfiguring the device | No problem |
| Row Address | A program or erase command will go to the wrong internal address thereby destroying data | No problem |
| Column Address | A data load command will overwrite data in the wrong part of the page buffer thereby destroying data | No problem |
| Write Register | Operation mode may be reconfigured, link reset may be required | No problem |

Referring to FIGS. 3 and 4, the target device 200 may be checked for errors and the command may be aborted if an error is detected. In accordance with at least one example embodiment, an extra error code byte is appended to each memory device-destined command packet that may be generated by the flash command engine 322. In some embodiments packets may be truncated by the target device to save power in the ring. There is no problem truncating read packets or the data portion of combined command and program data packets. However, the command portion of the packet plus this extra error code byte should not be truncated by the devices in the ring so that the controller 310 can check the full packet for errors. If an error is detected, the controller 310 can then read the device status registers 249 of the memory devices to determine whether devices in the ring also detected the error and whether the command was actually executed. In accordance with some examples, the target device, which is the device 200 corresponding to the Device ID field in the first byte of the packet, will calculate the error code based on the received command bytes and compare the result to the received error code byte. If there is any difference, the command will not be executed and a transmission error flag will be set in the status register 249. Alternatively, if the error code supports error correction, the device 200 could correct the error and execute the command. There are many contemplated possibilities for error detecting codes such as, for example, Cyclic Redundancy Code (CRC), Bose-Chaudhuri-Hocquenghem (BCH) code, Reed-Solomon (RS) code; however in accordance with at least one example embodiment a Hamming code is used which allows the location of a single bit error to be identified, and is able to detect all double bit errors. Table 2 below details the bits of an example 7-byte command packet with an additional error code byte.

TABLE 2

Example 7-Byte Command Packet with Additional Error Code Byte

| | bit7 | bit6 | bit5 | bit4 | bit3 | bit2 | bit1 | bit0 |
|---|---|---|---|---|---|---|---|---|
| Byte0 | D12 | D11 | D10 | D9 | D7 | D6 | D5 | D3 |
| Byte1 | D21 | D20 | D19 | D18 | D17 | D15 | D14 | D13 |
| Byte2 | D29 | D28 | D27 | D26 | D25 | D24 | D23 | D22 |
| Byte3 | D38 | D37 | D36 | D35 | D34 | D33 | D31 | D30 |
| Byte4 | D46 | D45 | D44 | D43 | D42 | D41 | D40 | D39 |
| Byte5 | D54 | D53 | D52 | D51 | D50 | D49 | D48 | D47 |
| Byte6 | D62 | D61 | D60 | D59 | D58 | D57 | D56 | D55 |
| Byte7 | P0 | P64 | P32 | P16 | P8 | P4 | P2 | P1 |

D0-D62 - Data Payload bits
P0-P64 - Parity bits

A single bit error can be corrected, since the location of a single bit error is known. Also, a two bit error can be detected but not corrected. This type of code is known as a SECDED code (Single Error Correction, Double Error Detection).

Figure 5:
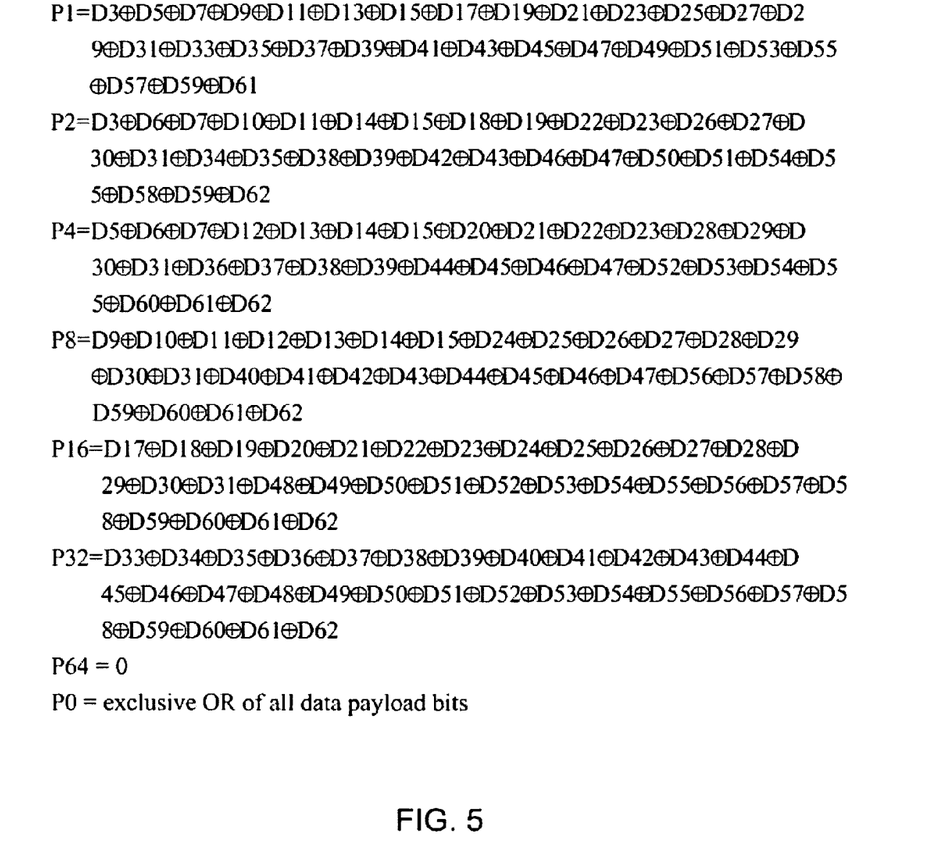
FIG. 5 shows parity bits calculation in accordance with an example embodiment.

Thus, Hamming codes provide single bit error correction and two-bit error detection. The 7 byte payload shown in Table 2 covers all instructions mentioned in previously mentioned US published patent applications Nos. 2008/0049505 A1 and 2008/0052449 A1. However, the 8-bit Hamming code is sufficient to cover a 15 byte payload, allowing future extensions to larger possible command sets. For command packets less than 7 bytes, the non-existent data bits can be assumed to be zero. The parity bits are calculated as shown in FIG. 5

If the parity bits calculated on the received data payload bits differ from the received parity bits, the differences point to the data bit which is in error. For example, if D3 was received in error, the calculated parity bits P0, P1 and P2 would differ from the received parity bits. A 7-bit binary word having a '1' where respective parity bits P64,P32,P16,P8,P4, P2,P1 differ and '0' where they are the same, i.e. 0,0,0,0,0,1,1 points to D3 where the single bit error occurred. P0 will always differ if there is a single error in the payload. If there is a single '1' in the word (i.e. only one calculated parity bit differs from the received parity bit) it indicates an error in a parity bit. If the calculated parity bit P0 is the same as the received P0 and at least one of the other parity bits differs, then there is a double error in the packet that cannot be corrected.

In accordance with some example embodiments, the status register 249 (FIG. 3) includes an additional bit to indicate that a command packet failure occurred.

Now in one example, each of one or more of the memory devices of the system having the point-to-point ring topology is a memory device comprising four banks. In such an example there may be a fully occupied byte of the status register that includes a Ready/Busy flag and a Pass/Fail flag for each memory bank. Therefore an additional byte should be added as shown in Table 3 below:

TABLE 3

Status Register Definition in Accordance with an Example
Embodiment, and the Status Register Definition
Supporting Command Packet Failure Flag

|       | bit7 | bit6 | bit5 | bit4 | bit3 | bit2 | bit1 | bit0 |
|-------|------|------|------|------|------|------|------|------|
| Byte0 | P/F3 | R/B3 | P/F2 | R/B2 | P/F1 | R/B1 | P/F0 | R/B0 |
| Byte1 | 0    | 0    | 0    | 0    | 0    | 0    | 0    | ERR  |

R/Bn - Ready/Busy flag for memory bank n ('0' - Ready, '1' - Busy)
P/Fn - Pass/Fail flag for memory bank n ('0' - Pass, '1' - Fail)
ERR - Command Packet Error flag ('0' - no error, '1' - error detected and command not executed)

The ERR flag for the above example embodiment is persistent. It will remain '1' until a read status register command is received following which it will be cleared.

If the device supports single bit error correction, the status register format as shown in Table 4 below may be used:

TABLE 4

Status Register Definition in Accordance with Another Example
Embodiment, the Status Register Definition Supporting
Command Packet Failure Flags and Single Bit Error Correction

|       | bit7 | bit6 | bit5 | bit4 | bit3 | bit2 | bit1 | bit0 |
|-------|------|------|------|------|------|------|------|------|
| Byte0 | P/F3 | R/B3 | P/F2 | R/B2 | P/F1 | R/B1 | P/F0 | R/B0 |
| Byte1 | 0    | 0    | 0    | 0    | 0    | 0    | ERR2 | ERR1 |

R/Bn - Ready/Busy flag for memory bank n ('0' - Ready, '1' - Busy)
P/Fn - Pass/Fail flag for memory bank n ('0' - Pass, '1' - Fail)
ERR1 - Command Packet Single Bit Error flag ('0' - no error, '1' - single biterror detected and corrected)
ERR2 - Command Packet Two Bit Error flag ('0' - no error or single biterror, '1' - two bit error detected and command not executed)

It will be understand that the above described status register implementation details will vary amongst different example memories. For instance, for those memories having fewer than four memory banks, the use of a single byte status register is a contemplated possibility. Also, the use of a greater than two byte status register is a contemplated possibility, especially for memories having more than four memory banks. Additionally, the status bits can be persistent until a status read command is received or can be cleared on receiving any subsequent valid command.

In accordance with at least one example embodiment, the controller 310 (FIG. 4) can determine that a command packet error has occurred either by recalculating the parity bits as in the memory devices, or by simply comparing each word of the transmitted command packet with the received packet. A difference between the latter approach and the former is that the latter approach can identify multi-bit errors. If an error is detected, the controller 310 should then determine whether the error occurred before or after the target device. The controller 310 should issue a status register read command to the target device 200 (FIG. 3) in order to read the status register 249. Alternatively, in the case of a Device Address field error, the controller 310 should issue a status register read command to the device that erroneously thinks it is the intended recipient of the command packet (hereinafter referred to as the erroneously addressed device) to determine the state of the error flag.

Figure 6:
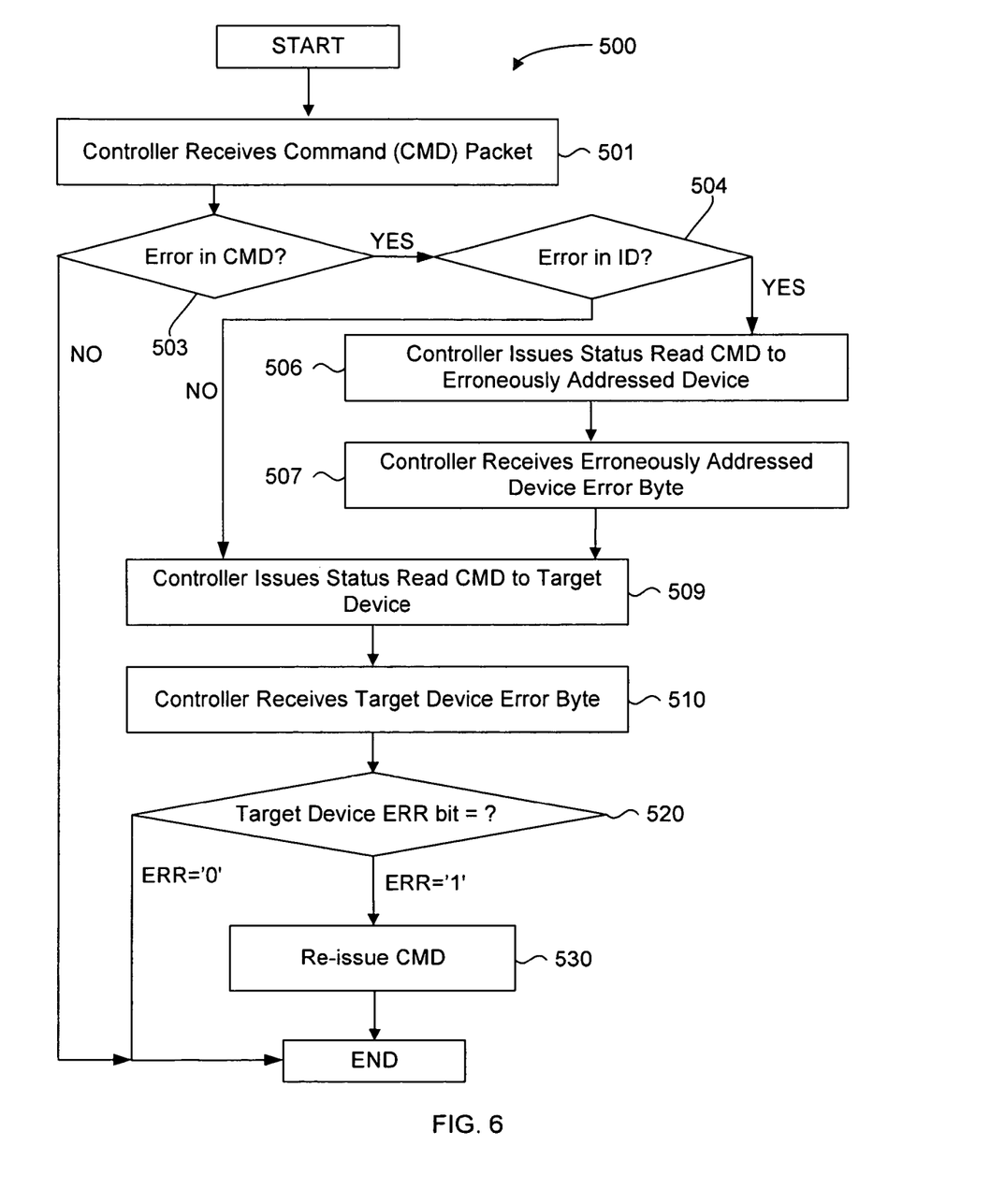
FIG. 6 shows in flow chart form, a method of handling an error in accordance with an example embodiment.

FIG. 6 shows in flow chart form, a method 500 in accordance with an example embodiment. Initially at action 501, the controller receives the command packet after it has circulated around the ring, and the controller checks for errors at action 503. If there are no errors, no further actions need to be taken in connection with the illustrated method; however if at least one error exists, then action 504 follows.

At the action 504, a determination is made as to whether the error occurred in the ID field. If the error did not occur in the ID field, then action 509 follows (the action 509 is described later on in this patent specification). If the error occurred in the ID field, then action 506 follows. At the action 506, the controller 310 (FIG. 4) issues a status read command to the erroneously addressed device, which in due course causes the status register of the erroneously addressed device to be read and will clear a persistent error bit indication of the status register. Next the controller receives the erroneously addressed device byte at action 507.

The action 509 follows the action 507. At the action 509, the register of the target device is read and then, as shown at the next action 510, the controller 310 (FIG. 4) receives, from the last device in the ring, an error byte (for example "Byte 1" shown in previous Table 3) of the target device. This action will clear the persistent error bit indication in the target device. In some examples, this error byte is provided to the ECC manager 324 via the flash device interface 326. Next at action 520, the ECC manager 324 may determine whether the ERR bit of the error byte is '0' or '1'. If the ERR bit is '0', this means that the command was properly received at the target device, and that the error occurred somewhere in the ring after the target device. In such a case, the command does not need to be re-issued. If the ERR bit is '1', this means that the error occurred somewhere before the target device. In such a case, the command is re-issued (action 530). As will be understood by those skilled in the art, the flash command engine 322 may cause, under instruction of the CPU 312, re-issuance of the command.

In some example embodiments, every device in the ring checks the command packet for errors and sets the error flag appropriately. The controller 310 (FIG. 4) can then check the status register 249 (FIG. 3) of every device in the ring to determine at which point the error occurred and whether the target device received and executed the command. Rather than sending individual status register commands to each device in the ring, another approach would be to use a broadcast status read command. Consistent with previously mentioned US published patent application No. 2008/0049505 A1, there may exist a special device address such as, for instance, "111111", that is recognized as the Broadcast Device Address. Normal comparison with local Device ID is overridden in the case of the Broadcast Device Address.

Figure 7:
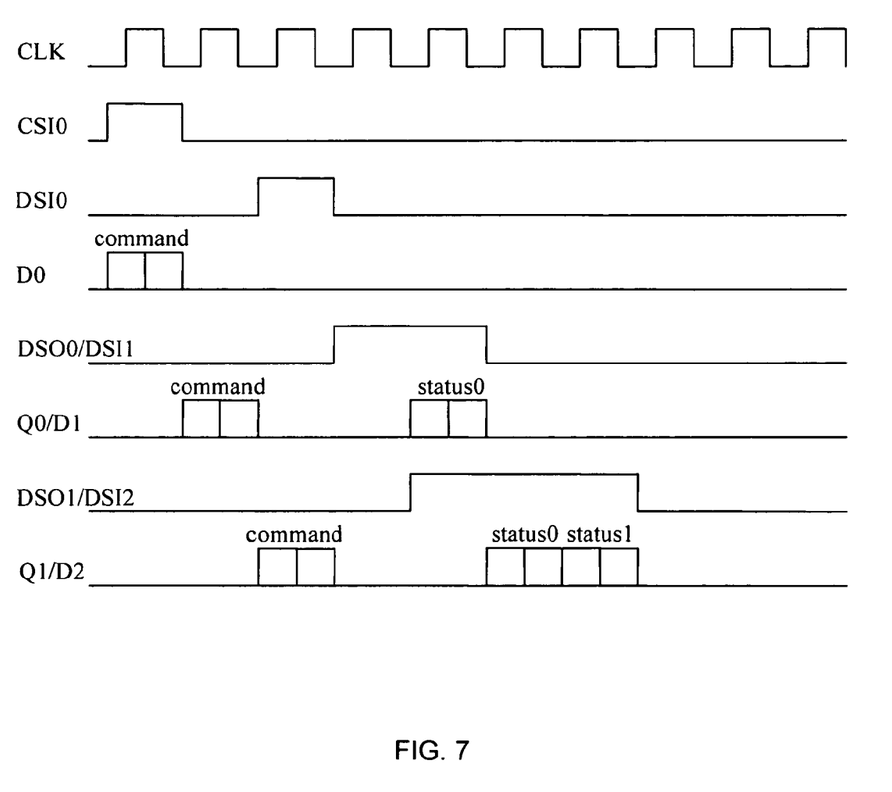
FIG. 7 is a timing diagram showing the operation of a broadcast status read command in accordance with an example embodiment.

FIG. 7 is a timing diagram showing the operation of a broadcast status read command in accordance with an example embodiment. In the timing diagram, a plurality of devices are represented by for example, signal illustrations for D0, Q0/D1, Q1/D2, in order to provide clear illustrative detail in relation to the nature of the broadcast status read command being communicated through more than one device in the ring.

In accordance with the illustrated example embodiment of FIG. 7, Device 0 receives a 2-byte broadcast read status command on D0 which is delineated by the CSI0 signal. A few clock cycles later, it receives data strobe signal DSI0 indicating that the contents of the status register should be output on Q0. Device 0 extends the output data strobe DSO0 by one clock cycle and outputs the 2-byte status register data on Q0 within the timeslot indicated by the extended portion of the DSO0 strobe. In this way the length of the data strobe pulse increases with each device on the ring to provide a burst of status information from every device on the ring. This command is useful to determine where in the ring a command packet error occurred when all devices check the command packet for errors. It is also useful in normal operation for checking the status of multiple read, program, and erase operations occurring simultaneously in different memory devices.

A broadcast status read operation where every device has an equal length 2-byte status register has been described. This technique can also work for devices having different status register lengths. On ring initialization, the controller reads the device information registers of each device and determines the length of each device's status register. During the broadcast register read operation, each device appends it's status register information, whatever the length, onto the burst, and extends the output data strobe to encompass this appended information. On receiving the full burst of status information, the controller knows the number of bytes expected from each device and can separate the information.

A memory device supporting error detection and/or correction as described may be programmable to allow the error detection and/or correction to be disabled. For example, on reset the memory device may have error detection and correction disabled. If the controller wants to employ error detection and/or correction it may write one or more bits in a control register in each memory device, for example, to enable these functions. If the controller disables these functions, the additional parity bit at the end of each command packet may either be eliminated to save one bus timeslot, or may be loaded with null data that will be ignored by the memory devices. In this way low cost systems do not have to support error correction and/or detection, but a common memory device can serve low cost systems in addition to those requiring command packet error detection and/or correction.

In some examples, there is provided an error detection and correction scheme that is similar to the previously described scheme, and that is applied to read and write data. In a specific implementation of this additional scheme, the same parity checking logic circuits as employed for the command packet may be utilized to save chip area and complexity. Table 5 below details an example write data packet with a command parity byte and a data parity byte.

TABLE 5

Example Write Data Packet with Command Parity Byte and Data Parity Byte

| | |
|---|---|
| Byte0 | Device ID |
| Byte1 | Command |
| Byte2 | Column Address |
| Byte3 | Column Address |
| Byte4 | Command Parity |
| Byte5 | Write Data |
| Byte6 | Write Data |
| Byte7 | Write Data |
| Byte8 | Write Data Parity |

In example of Table 5, bytes 0 to 4 comprise the command portion and function as described earlier. Any number of write data bytes up to the full page size can follow the command portion. The final byte in the packet is the write data parity byte calculated on the write data bytes. If the same SECDED Hamming code described earlier is to be used, it would only provide single error correction coverage for up to 15 bytes. After 15 bytes the parity equations would simply wrap-around and single bit error correction could no longer be implemented. Alternatively, a more robust CRC code having better error coverage for large data packets could be selected. Separate error detection bits for command and data could be provided in the status registers.

With regards to read data parity, this may be accomplished in a similar way. On reading data from the internal memory array, the memory device would calculate a parity byte to append to the end of the read data packet. The controller determines the number of bytes to be read by controlling the length of the Data Strobe signal. When the memory device detects the falling edge of the Data Strobe signal terminating the read data burst, the memory device outputs the cumulative parity byte. On receiving read data, the controller performs the identical parity calculation and compares the result with the received parity byte that was appended to the end of the read data burst to determine whether there was a bit error. This is particularly useful for register read commands such as status register read commands since there is no way a user can superimpose error correcting codes on register data. With normal read and write data to and from the memory array, the user can select an appropriate error detection code to store with data.

Although some example embodiments herein shown and described relate to a system having a point-to-point ring topology, because there is a series-interconnection configuration that exists between a controller device of the system and a plurality of semiconductor memory devices of the system, it will be understood that some alternative example embodiments relate to other types of systems such as, for example, those that would be characterized as being a multi-drop system.

Other variations are contemplated. For instance, in another example similar to the 4-bank memory device example described previously in connection with Tables 3 and 4, each of one or more of the memory devices of a system having the point-to-point ring topology is a composite memory comprising a bridging device and four discrete memory devices. (For further detail regarding contemplated composite memory, reference is made to U.S. patent application Ser. No. 12/401, 963 entitled "A Composite Memory Having a Bridging Device for Connecting Discrete Memory Devices to a System", the entire contents of which are herein incorporated by reference.) In such an example the status register may be in the bridging device.

A number of example embodiments can be applied to any suitable solid state memory systems such as, for example, those that include NAND Flash EEPROM device(s), NOR Flash EEPROM device(s), AND Flash EEPROM device(s), DiNOR Flash EEPROM device(s), Serial Flash EEPROM device(s), DRAM device(s), SRAM device(s), Ferro RAM device(s), Magnetic RAM device(s), Phase Change RAM device(s), or any suitable combination of these devices. These techniques are also applicable to both memory and non-memory devices which communicate over a ring or other interconnection topology, whether organized as single bus master and multiple slaves or multiple bus master configurations.

It will be understood that when an element is herein referred to as being "connected" or "coupled" to another element, it can be directly connected or coupled to the other element or intervening elements may be present. In contrast, when an element is herein referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Certain adaptations and modifications of the described embodiments can be made. Therefore, the above discussed embodiments are considered to be illustrative and not restrictive.

What is claimed is:

1. A system comprising:
    a plurality of serially interconnected semiconductor memory devices arranged in a point-to-point ring topology; and
    a controller device to communicate with the semiconductor memory devices, the controller device comprising:
    a command engine to generate a memory device-destined packet, a portion of the packet comprising at least one command byte;
    an output to output the packet to a first device of the plurality of semiconductor memory devices;
    an input to receive the packet from a last device of the plurality of semiconductor memory devices after having been communicated through each of the plurality of semiconductor memory devices arranged in the point-to-point ring topology; and
    an error manager to determine, based on the received packet, whether an error occurred in transmission of the packet within the system, and
    the command engine being configured to selectively reissue the packet if the error manager determines that the error occurred at a specific position in the ring topology.

2. The system as claimed in claim 1, wherein each of the plurality of semiconductor memory devices include an error manager.

3. The system as claimed in claim 2, wherein an at least one error manager of the plurality of semiconductor memory devices is configured to prevent execution of a command defined by the packet upon error detection.

4. The system as claimed in claim 1, wherein the controller device is configured to receive an erroneously addressed device error byte, and the error manager is configured to process the erroneously addressed device error byte to determine whether a device before an intended target device was erroneously addressed.

5. The system as claimed in claim 1, wherein the command engine is configured to cause re-issuance of a command if the device before the intended target device was erroneously addressed.

6. The system as claimed in claim 1, wherein the command engine is capable of generating a broadcast command receivable by each of the plurality of semiconductor memory devices in order that information in a respective status register in each of the plurality of semiconductor memory devices may be provided in a sequential fashion to the controller device.

7. The system as claimed in claim 6, wherein the error manager is configured to process each information of each status register to determine at which point in the ring topology the error occurred.

8. The system as claimed in claim 7, wherein the command engine is further configured to reissue the packet if the error occurred before a target device.

9. The system as claimed in claim 1, wherein the plurality of semiconductor memory devices are non-volatile memory devices.

10. The system as claimed in claim 9, wherein the non-volatile memory devices are NAND flash memory devices.

11. The system as claimed in claim 1, wherein the error manager is configured to calculate parity bits based on the portion of the packet as received and compares the calculated parity bits to another portion of the packet as received to determine whether the error occurred.

12. The system as claimed in claim 1, wherein the error manager is configured to compare the received packet to the outputted packet to determine whether the error occurred.

13. The system as claimed in claim 1, wherein the portion of the packet includes either a program command or an erase command.

14. The system as claimed in claim 1, wherein another portion of the packet includes parity bits.

15. The system as claimed in claim 14, wherein the parity bits facilitate command error correction.

16. The system as claimed in claim 14, wherein the parity bits facilitate command error detection in accordance with a Hamming code error detection scheme.

17. The system as claimed in claim 15, wherein each of the plurality of semiconductor memory devices includes a respective error manager to attempt correction of the packet if the error is detected.

18. The system as claimed in claim 17, wherein, if the error is determined to have occurred, the error manager of the controller device is configured to determine whether the error in the received packet is correctable and reissue the packet if the error is not correctable.

19. The system as claimed in claim 18, wherein the controller device is further configured to recognize that a single bit error in the received packet is correctable and a multiple bit error is not correctable.

20. A method carried out in a controller device that communicates with a plurality of serially interconnected semiconductor memory devices arranged in a point-to-point ring topology, the method comprising:
    generating a memory device-destined packet, a portion of the packet comprising at least one command byte;
    outputting the packet to a first device of the plurality of semiconductor memory devices;
    receiving the packet from a last device of the plurality of semiconductor memory devices after having been communicated through each of the plurality of semiconductor memory devices arranged in the point-to-point ring topology; and
    determining, based on the received packet, whether in transmission of the packet from the controller device, through the semiconductor memory devices and back to the controller device, an error occurred; and
    selectively reissuing the packet if the error occurred at a specific position in the ring topology.

21. The method as claimed in claim 20, further comprising generating a broadcast command for each of the plurality of semiconductor memory devices in order that information in a respective status register in each of the plurality of semiconductor memory devices may be provided in a sequential fashion to the controller.

22. The method as claimed in claim 21, further comprising processing each information of each status register to determine at which point in the ring topology the error occurred.

23. The method as claimed in claim 22, further comprising reissuing the packet if the error occurred before a target device.

24. The method as claimed in claim 20, further comprising:
    calculating parity bits based on the portion of the packet as received; and
    comparing the calculated parity bits to another portion of the packet as received to determine whether the error occurred.

25. The method as claimed in claim 20, further comprising comparing the received packet to the outputted packet to determine whether the error occurred.

26. The method as claimed in claim 20, wherein the portion of the packet includes either a program command or an erase command.

27. The method as claimed in claim 20, wherein another portion of the packet includes parity bits.

28. The method as claimed in claim 27, wherein the parity bits facilitate command error correction.

* * * * *